(12) United States Patent
Togashi

(10) Patent No.: US 8,916,916 B2
(45) Date of Patent: Dec. 23, 2014

(54) IMAGING DEVICE, METHOD OF MANUFACTURING THE SAME, AND ELECTRONIC APPARATUS

(75) Inventor: Hideaki Togashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 235 days.

(21) Appl. No.: 13/358,258

(22) Filed: Jan. 25, 2012

(65) Prior Publication Data

US 2012/0217558 A1 Aug. 30, 2012

(30) Foreign Application Priority Data

Feb. 24, 2011 (JP) ................................. 2011-038668

(51) Int. Cl.
*H01L 31/0216* (2014.01)
*H01L 27/146* (2006.01)
*H01L 21/768* (2006.01)

(52) U.S. Cl.
CPC ..... *H01L 27/14614* (2013.01); *H01L 21/76898* (2013.01)
USPC .................... 257/292; 257/291; 257/E31.119; 257/E31.11; 438/73

(58) Field of Classification Search
CPC .................. H01L 27/14689; H01L 29/66666; H01L 27/14643; H01L 29/7813; H01L 27/14621; H01L 29/7827
USPC ..................... 257/291–292, E31.11, E31.119
See application file for complete search history.

(56) References Cited

U.S. PATENT DOCUMENTS

| | | | |
|---|---|---|---|
| 7,265,402 B2 * | 9/2007 | Koyanagi ...................... | 257/292 |
| 2004/0135215 A1 * | 7/2004 | Song .............................. | 257/379 |
| 2009/0095999 A1 * | 4/2009 | Jang .............................. | 257/301 |
| 2009/0280610 A1 * | 11/2009 | Umezaki ....................... | 438/270 |
| 2009/0303371 A1 * | 12/2009 | Watanabe et al. ............. | 348/311 |
| 2010/0117126 A1 * | 5/2010 | Takahashi ..................... | 257/292 |

FOREIGN PATENT DOCUMENTS

| | | |
|---|---|---|
| JP | 2006-278446 | 10/2006 |
| JP | 2008-258316 | 10/2008 |
| JP | 2010-114274 | 5/2010 |

* cited by examiner

*Primary Examiner* — David Vu
*Assistant Examiner* — Jonathan Han
(74) *Attorney, Agent, or Firm* — Dentons US LLP

(57) ABSTRACT

A solid-state imaging device includes: a substrate which is formed of a semiconductor and includes a first surface and a second surface which face opposite sides; a gate insulation film which is formed on a trench formed in the substrate to penetrate the first surface and the second surface; and a gate electrode which is embedded in the trench through the gate insulation film to be exposed to a second surface side of the substrate. A step difference is formed from the second surface of the substrate to a tip end surface of the gate electrode on the second surface side.

19 Claims, 10 Drawing Sheets

VARIATION

IMAGING DEVICE, METHOD OF MANUFACTURING THE SAME, AND ELECTRONIC APPARATUS

BACKGROUND

The present disclosure relates to an imaging device, a method of manufacturing the same, and an electronic apparatus, and more particularly, to an imaging device capable of providing superior pixel characteristics, a method of manufacturing the same, and an electronic apparatus.

In the related art, in an amplification type solid-state imaging device as represented by a CMOS (Complementary Metal Oxide Semiconductor) image sensor, charges are transferred from a photoelectric conversion device (photodiode) which is present at a deep position from a front surface of a semiconductor substrate to the vicinity of the front surface.

For example, as one of a method of transferring charges, a technique using a vertical transistor is disclosed in Japanese Unexamined Patent Application Publication No. 2008-258316. The vertical transistor is formed by forming a trench (vertical groove) by dry etching from a front surface side of a semiconductor, by forming a gate insulation film, and then by inserting a gate electrode.

Further, a technique in which a vertical transistor is used and charges which are photoelectrically converted can be efficiently lifted from a photodiode which is present at a deep position to be transferred to a floating diffusion region is disclosed in Japanese Unexamined Patent Application Publication No. 2010-114274.

Further, it is possible to achieve a small area of pixel size by using the vertical transistor, compared with a structure in which a conductive well which is the same as a photodiode disclosed in Japanese Unexamined Patent Application Publication No. 2006-278446 is used as a transfer path. Particularly, since it is necessary to lift charges from a photodiode which is present at a deep position for transfer in a vertical spectral imaging device, it is effective to apply a vertical transistor structure so as to realize a vertical spectral imaging device of small pixels.

The vertical transistor structure in the related art will be described with reference to FIGS. 1A and 1B. Figs. 1A and 1B are cross-sectional views illustrating a configuration example of a solid-state imaging device in which a vertical transistor is formed. An upper side in Figs. 1A and 1B is a front surface side of the solid-state imaging device, and a lower side in Figs. 1A and 1B is a rear surface side of the solid-state imaging device.

As shown in FIG. 1A, in a solid-state imaging device 11, a PD (Photodiode) 13 is disposed at a deep position of a semiconductor substrate 12, and an FD (Floating diffusion) 14 is disposed on a front surface side of the semiconductor substrate 12. Further, a gate insulation film 15 is formed on the front surface of the semiconductor substrate 12 and a trench formed from the front surface side of the semiconductor substrate 12, and a gate electrode 16 is inserted into the trench. Further, an anti-reflection film 17 and an oxide film 18 are stacked on the rear surface side of the semiconductor substrate 12.

In such a solid-state imaging device 11, as voltage is applied to the gate electrode 16, the vertical transistor 19 has a structure in which charges accumulated on the PD 13 are transferred to the FD 14 by photoelectric conversion.

However, in a manufacturing process of the vertical transistor 19, it is difficult to control the depth of the trench when the trench is formed on the semiconductor substrate 12, and thus, the depth of the trench varies for each pixel. Thus, as shown in FIG. 1B, the interval between the gate electrode 16 which forms the vertical transistor 19 and the rear surface of the semiconductor substrate 12 varies, and this variation badly affects pixel characteristics.

That is, the variation in the interval between the vertical transistor 19 and the rear surface of the semiconductor substrate 12 is caused by the variation in the depth control in a dry etching process of forming the vertical transistor 19, or may be caused by variation in the film thickness of the semiconductor substrate 12. Further, the variation in the film thickness of the semiconductor substrate 12 is emphasized in a semiconductor substrate thinning process of a rear surface irradiation type semiconductor manufacturing process. Further, the variation in the interval between the vertical transistor 19 and the rear surface of the semiconductor substrate 12 may be referred to as a variation in the interval between the PD 13 which is present at a deep position from the front surface side of the semiconductor substrate 12 and a bottom section of the vertical transistor 19 or a variation in the cover amount. Since the interval between the PD 13 and the bottom section of the vertical transistor 19 considerably affects the transfer efficiency of the charges which are photoelectrically converted, it is necessary to suppress the variation as small as possible.

Thus, in a rear surface irradiation type imaging device in which light irradiates the rear surface of the semiconductor substrate 12, it is effective to employ a penetration-type vertical transistor structure in which the vertical transistor 19 is formed by allowing the gate electrode 16 to penetrate the semiconductor substrate 12 up to the rear surface thereof.

Next, the penetration-type vertical transistor structure will be described with reference to FIGS. 2A to 2C. FIGS. 2A to 2C are cross-sectional views illustrating a configuration example of a solid-state imaging device of the penetration-type vertical transistor structure. An upper side in FIGS. 2A to 2C is a front surface side of the solid-state imaging device, and a lower side in FIGS. 2A to 2C is a rear surface side of the solid-state imaging device.

As shown in FIG. 2A, in a solid-state imaging device 11' of the penetration-type vertical transistor structure, a penetration-type vertical transistor 19' is configured by inserting a gate electrode 16' into the trench formed to penetrate the semiconductor substrate 12 up to the rear surface thereof. In a penetration-type vertical transistor 19' with such a configuration, the depth of the gate electrode 16' becomes the same for each pixel, and the above-described variation is removed.

However, in the solid-state imaging device 11', a gate insulation film 15' is not formed on a tip end surface side of the gate electrode 16', and thus, the tip end surface of the gate electrode 16' is in contact with an anti-reflection film 17. Thus, as shown in FIG. 2B, there is a problem that electric current (gate leakage current) flows between the semiconductor substrate 12 and the gate electrode 16' through the anti-reflection film 17 in a tip end section of the penetration-type vertical transistor 19', in the solid-state imaging device 11' of the penetration-type vertical transistor structure.

Particularly, as shown in FIG. 2C, in a manufacturing process, the anti-reflection film 17 formed on the rear surface side of the semiconductor substrate 12 is formed so that the gate insulation film 15' of the tip end section of the penetration-type vertical transistor 19' retreats and the anti-reflection film 17 is interposed between the semiconductor substrate 12 and the gate electrode 16'. In this case, the gate leakage current easily flows between the semiconductor substrate 12 and the gate electrode 16'. Further, the gate leakage current easily flows in a similar way to a case where the oxide film 18 is formed between the semiconductor substrate 12 and the gate electrode 16'.

The generation of the gate leakage current is caused by deterioration of the film quality of the anti-reflection film 17 and the oxide film 18 which are formed on the rear surface side. That is, since it is difficult to form the materials formed on the rear surface side at a high temperature due to the limit of heat-resisting temperature of an additive on a metal wiring layer or a wafer bonding surface, the film quality deteriorates, and electric current easily flows compared with the insulation film formed in the front surface process. Thus, if the anti-reflection film 17 and the oxide film 18 are formed in a region between the semiconductor substrate 12 and the gate electrode 16' to which an electric field is applied or in the vicinity thereof, the gate leakage current is generated between the semiconductor substrate 12 and the gate electrode 16'.

SUMMARY

As described above, in the penetration-type vertical transistor structure in the related art, the gate leakage current is generated between the semiconductor substrate and the gate electrode. Thus, a large amount of carriers are generated in the tip end section of the penetration-type vertical transistor and the carriers flow into the photodiode in accumulation or transfer of charges, which causes deterioration of pixel characteristics such as generation of white spots or dark current.

Accordingly, it is desirable to provide a technique which is capable of achieving superior pixel characteristics.

According to an embodiment of the present disclosure, there is provided a solid-state imaging device including: a substrate which is formed of a semiconductor and includes a first surface and a second surface which face opposite sides; a gate insulation film which is formed on a trench formed in the substrate to penetrate the first surface and the second surface; and a gate electrode which is embedded in the trench through the gate insulation film to be exposed to a second surface side of the substrate, wherein a step difference is formed from the second surface of the substrate to a tip end surface of the gate electrode on the second surface side.

According to another embodiment of the present disclosure, there is provided an electronic apparatus including a solid-state imaging device which includes: a substrate which is formed of a semiconductor and includes a first surface and a second surface which face opposite sides; a gate insulation film which is formed on a trench formed in the substrate to penetrate the first surface and the second surface; and a gate electrode which is embedded in the trench through the gate insulation film to be exposed to a second surface side of the substrate, wherein a step difference is formed from the second surface of the substrate to a tip end surface of the gate electrode on the second surface side.

According to still another embodiment of the present disclosure, there is provided a method of manufacturing a solid-state imaging device, the method including: forming a gate insulation film on a trench which is formed in a substrate which is formed of a semiconductor and includes a first surface and a second surface which face opposite sides and penetrates the first surface and the second surface; embedding a gate electrode in the trench through the gate insulation film to be exposed to a second surface side of the substrate; and forming a step difference from the second surface of the substrate to a tip end surface of the gate electrode on the second surface side.

According to the embodiments, the gate insulation film formed on the trench which is formed in the substrate which is formed of semiconductor and includes the first surface and the second surface which face opposite sides and penetrates the first surface and the second surface. Further, the gate electrode is embedded in the trench through the gate insulation film to be exposed to the second surface side of the substrate. Further, the step difference is formed from the second surface of the substrate to the tip end surface of the gate electrode on the second surface side.

According to the embodiments, it is possible to provide superior pixel characteristics.

DETAILED DESCRIPTION OF EMBODIMENTS

Hereinafter, specific embodiments of the present disclosure will be described in detail with reference to the accompanying drawings.

Figure 3A:
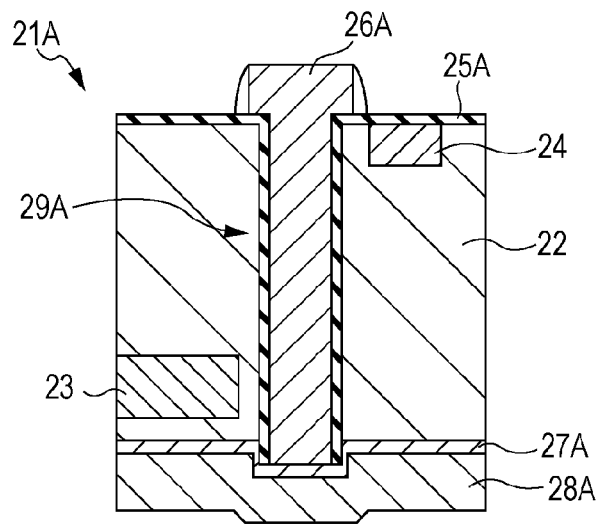
FIGS. 3A to 3C are cross-sectional views illustrating configuration examples of a solid-state imaging device according to of embodiments of the present disclosure.
Figure 3B:
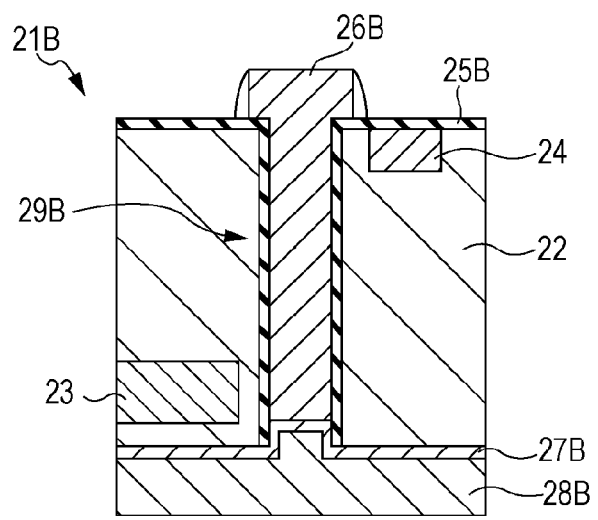
Figure 3C:
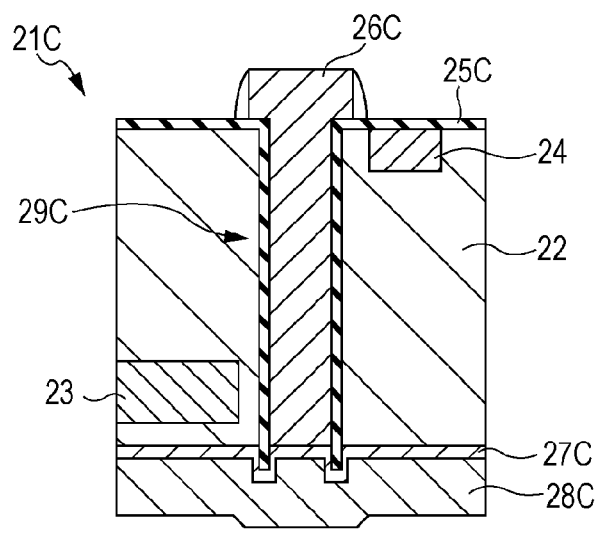

FIGS. 3A to 3C are cross-sectional views illustrating configuration examples of a solid-state imaging device according to first to third embodiments of the present disclosure.

FIG. 3A shows a solid-state imaging device 21A according to the first embodiment, FIG. 3B shows a solid-state imaging device 21B according to the second embodiment, and FIG. 3C shows a solid-state imaging device 21C according to the third embodiment. Further, an upper side in FIGS. 3A to 3C is a front surface side and a lower side in FIGS. 3A to 3C is a rear surface side.

As shown in FIG. 3A, the solid-state imaging device 21A includes a semiconductor substrate 22, a PD 23, an FD 24, a gate insulation film 25A, a gate electrode 26A, an anti-reflection film 27A, and an oxide film 28A. Further, in the solid-state imaging device 21A, a penetration-type vertical transistor 29A is formed with a structure in which charges which are accumulated in the PD 23 by photoelectric conversion are transferred to the FD 24 as voltage is applied to the gate electrode 26A.

Further, in the solid-state imaging device 21A, the semiconductor substrate 22 is a substrate made of thin silicon formed by semiconductor, for example. In FIGS. 3A to 3C, the upper side of the semiconductor substrate 22 becomes the front side (first surface side) of the semiconductor substrate 22 and the lower side becomes the rear side (second surface side) thereof. The PD 23 is disposed for each of a plurality of pixels disposed along the surface direction of the solid-state imaging device 21A, is disposed at a deep position when seen from the front surface side of the semiconductor substrate 22, and performs photoelectric conversion by light which irradiates the rear surface side of the solid-state imaging device 21A. The FD 24 is formed on the front surface side of the semiconductor substrate 22. The charges which are accumulated in the PD 23 by the photoelectric conversion are transferred to the FD 24.

The gate insulation film 25A is a film which provides isolation between the semiconductor substrate 22 and the gate electrode 26A, and the gate electrode 26A is an electrode which controls the transfer of charges from the PD 23 to the FD 24. Further, the anti-reflection film 27A is a film which reduces reflection of the light which irradiates the solid-state imaging device 21A to increase light transmittance into the semiconductor substrate 22, and the oxide film 28A is a film which insulates the rear surface side of the semiconductor substrate 22.

Figure 1A:
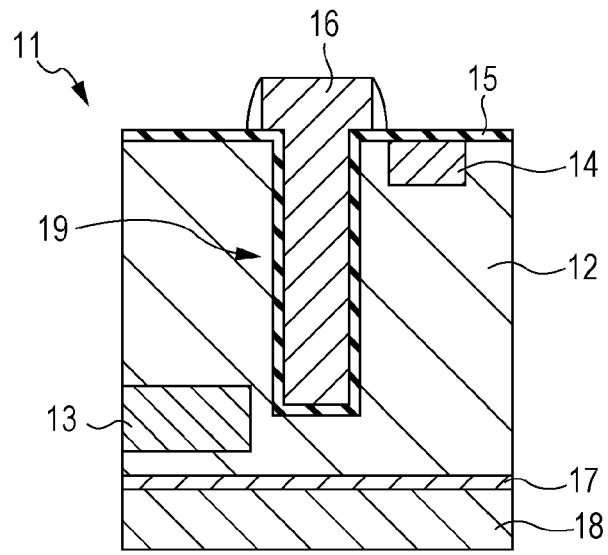
FIGS. 1A and 1B are cross-sectional views illustrating a structure of a vertical transistor in the relate art.
Figure 1B:
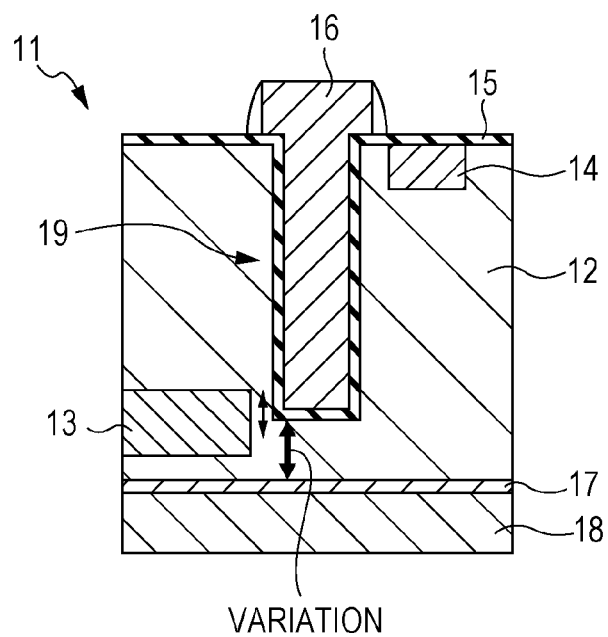
Figure 2A:
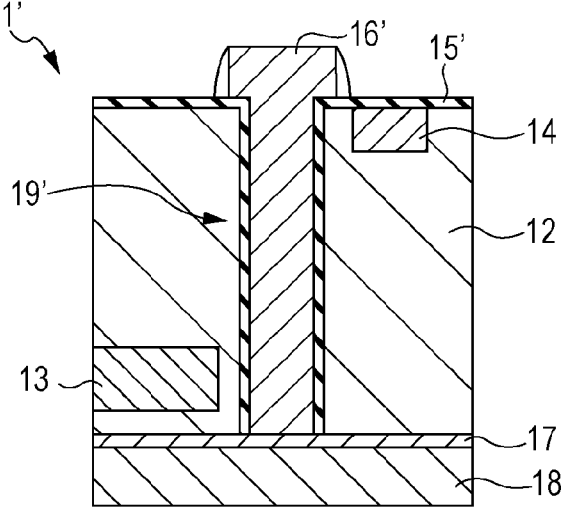
FIGS. 2A to 2C are cross-sectional views illustrating a structure of a penetration-type vertical transistor in the related art.
Figure 2B:
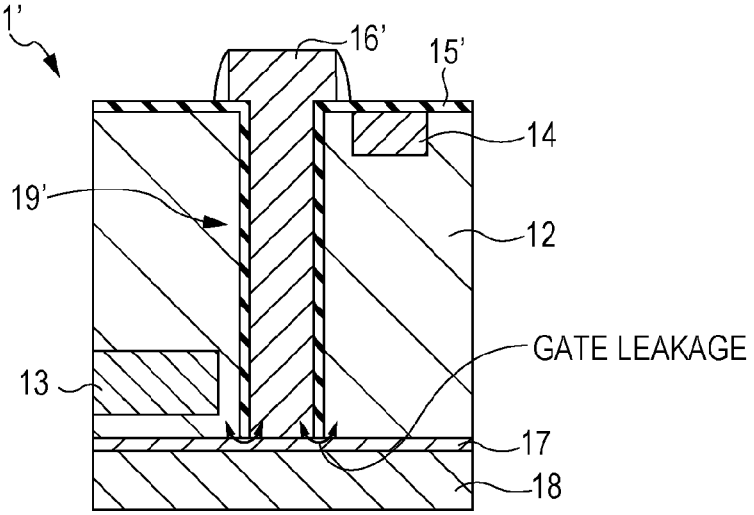
Figure 2C:
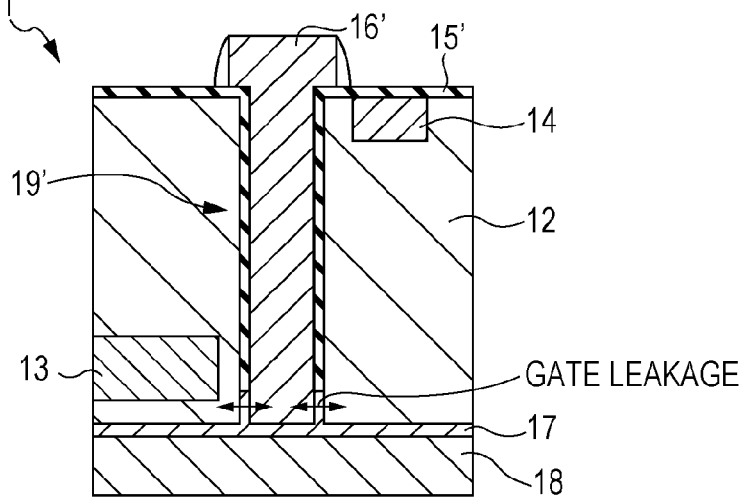

Further, in the solid-state imaging device 21A, a tip end section of the penetration-type vertical transistor 29A on the rear surface side is formed so that the gate insulation film 25A and the gate electrode 26A protrude from the surface of the semiconductor substrate 22 on the rear surface side, differently from the solid-state imaging device 11' shown in FIGS. 2A to 2C.

In this way, due to this step difference configuration in which the gate insulation film 25A and the gate electrode 26A protrude from the surface of the semiconductor substrate 22 on the rear surface side, the anti-reflection film 27A which is formed on the rear surface of the semiconductor substrate 22 is formed to have a convex shape with respect to the rear surface of the solid-state imaging device 21A. That is, the anti-reflection film 27A is formed on the rear surface of the semiconductor substrate 22 and the tip end surfaces of the gate insulation film 25A and the gate electrode 26A on the rear surface side, and also is formed along an outer peripheral surface of the gate insulation film 25A.

Accordingly, in the solid-state imaging device 21A, a leakage path becomes long according to the amount that the anti-reflection film 27A is formed along the outer peripheral surface of the gate insulation film 25A, compared with the leakage path through which the gate leakage current flows in the solid-state imaging device 11' shown in FIGS. 2A to 2C. Thus, in the solid-state imaging device 21A, it is possible to suppress generation of the leakage current between the semiconductor substrate 22 and the gate electrode 26A.

Further, as described with reference to FIG. 2C, in the solid-state imaging device 11', when the anti-reflection film 17 is formed to be interposed between the semiconductor substrate 12 and the gate electrode 16', the gate leakage current easily flows. On the other hand, in the solid-state imaging device 21A, the penetration-type vertical transistor 29A is formed so that the gate insulation film 25A and the gate electrode 26A protrude from the surface of the semiconductor substrate 22 on the rear surface side. With such a configuration, in a manufacturing process of the solid-state imaging device 21A, it is possible to further reliably suppress generation of the gate leakage current in the solid-state imaging device 21A, in a state where the anti-reflection film 27A or the like is not interposed between the semiconductor substrate 22 and the gate electrode 26A.

Further, as shown in FIG. 3B, the solid-state imaging device 21B includes the semiconductor substrate 22, the PD 23, the FD 24, a gate insulation film 25B, a gate electrode 26B, an anti-reflection film 27B, and an oxide film 28B. Further, in the solid-state imaging device 21B, a penetration-type vertical transistor 29B is formed so that the gate electrode 26B penetrates the semiconductor substrate 22 up to the rear surface side thereof. Hereinafter, description about the same parts as in the solid-state imaging device 21A will be omitted.

In the solid-state imaging device 21B, a tip end section of the penetration-type vertical transistor 29B on the rear surface side has a step difference configuration in which the gate insulation film 25B is formed up to the surface of the semiconductor substrate 22 on the rear surface side and the gate electrode 26B is recessed from the surface of the semiconductor substrate 22 on the rear surface side. That is, in the solid-state imaging device 21B, the gate insulation film 25B is formed to extend on the rear surface side with reference to the gate electrode 26B.

With such a configuration, in the solid-state imaging device 21B, the anti-reflection film 27B which is formed on the rear surface of the semiconductor substrate 22 is formed to have a convex shape with respect to the rear surface of the solid-state imaging device 21B. That is, the anti-reflection film 27B is formed on the rear surface of the semiconductor substrate 22 and the tip end surface of the gate electrode 26B on the rear surface side, and is also formed along an inner peripheral surface of the gate insulation film 25B.

Accordingly, in the solid-state imaging device 21B, in a similar way to the solid-state imaging device 21A, a leakage path becomes long according to the amount that the anti-reflection film 27B is formed along the inner peripheral surface of the gate insulation film 25B. Thus, in the solid-state imaging device 21B, it is possible to suppress generation of the gate leakage current between the semiconductor substrate 22 and the gate electrode 26B. Further, in a manufacturing process of the solid-state imaging device 21B, it is possible to further reliably suppress the generation of the gate leakage current in the solid-state imaging device 21B in a state where the anti-reflection film 27B or the like is not interposed between the semiconductor substrate 22 and the gate electrode 26B.

Further, as shown in FIG. 3C, the solid-state imaging device 21C includes the semiconductor substrate 22, the PD 23, the FD 24, a gate insulation film 25C, a gate electrode 26C, an anti-reflection film 27C, and an oxide film 28C. Further, in the solid-state imaging device 21C, a penetration-type vertical transistor 29C is formed so that the gate electrode 26C penetrates the semiconductor substrate 22 up to the rear surface side thereof. Hereinafter, description about the same parts as in the solid-state imaging device 21A will be omitted.

In the solid-state imaging device 21C, a tip end section of the penetration-type vertical transistor 29C on the rear surface side has a step difference configuration in which the gate insulation film 25C is formed up to the surface of the semiconductor substrate 22 on the rear surface side and protrudes from the surface of the semiconductor substrate 22 on the rear surface side. That is, in the solid-state imaging device 21C, the gate insulation film 25C is formed to protrude from the surfaces of the semiconductor substrate 22 and the gate electrode 26C on the rear surface side.

With such a configuration, in the solid-state imaging device 21C, the anti-reflection film 27C which is formed on the rear surface of the semiconductor substrate 22 is formed to have an annular convex shape along the gate insulation film 25C. That is, the anti-reflection film 27C is formed on the rear surface of the semiconductor substrate 22 and the tip end surface of the gate electrode 26C on the rear surface side, and is also formed along an outer peripheral surface and an inner peripheral surface of the gate insulation film 25C.

Accordingly, in the solid-state imaging device 21C, a leakage path becomes long according to the amount that the anti-reflection film 27C is formed along the outer peripheral surface and the inner peripheral surface of the gate insulation film 25C, that is, two times the leakage paths in the solid-state imaging devices 21A and 21B. Thus, in the solid-state imaging device 21C, it is possible to effectively suppress generation of the gate leakage current between the semiconductor substrate 22 and the gate electrode 26C, compared with the solid-state imaging devices 21A and 21B. Further, in a manufacturing process of the solid-state imaging device 21C, it is possible to further reliably suppress the generation of the gate leakage current in the solid-state imaging device 21C in a state where the anti-reflection film 27C or the like is not interposed between the semiconductor substrate 22 and the gate electrode 26C.

Further, in the solid-state imaging device 21C, since the gate insulation film 25C protrudes from the surfaces of the semiconductor substrate 22 and the gate electrode 26C on the rear surface side, voltage is not linearly applied between the semiconductor substrate 22 and the gate electrode 26C. That is, in the solid-state imaging device 21C, as the gate insulation film 25C protrudes, the anti-reflection film 27C and the oxide film 28C are formed so that a linear leakage path is not generated between the semiconductor substrate 22 and the gate electrode 26C. In this way, due to the configuration in which the linear leakage path is not generated, it is possible to reliably suppress the generation of the gate leakage current in the solid-state imaging device 21C, compared with the solid-state imaging device 21A or 21B. For example, in the solid-state image device 21A or 21B, in a case where the gate insulation film 25A or 25B microscopically retreats, the linear leakage path may be generated. On the other hand, in the solid-state imaging device 21C, since the gate insulation film 25C sufficiently protrudes, it is possible to reliably suppress the generation of the gate leakage current, without generating the linear leakage path.

Hereinafter, in a case where the gate insulation films 25A to 25C, the gate electrodes 26A to 26C, the anti-reflection films 27A to 27C, the oxide films 28A to 28C, and the penetration-type vertical transistors 29A to 29C do not have to be classified, respectively, they are referred to as the gate insulation film 25, the gate electrode 26, the anti-reflection film 27, the oxide film 28, and the penetration-type vertical transistor 29.

Here, materials which form the gate insulation film 25, the gate electrode 26, the anti-reflection film 27 and the oxide film 28 will be described.

The gate insulation film 25 is a silicon oxide film obtained by thermally oxidizing silicon, silicon oxynitride, or a high dielectric insulation film. As the high dielectric insulation film, hafnium oxide, hafnium silicate, nitrogen added hafnium aluminate, tantalum oxide, titanium dioxide, zirconium oxide, praseodymium oxide, yttrium oxide or the like is used.

The gate electrode 26 is formed of a doped silicon material such as PDAS (Phosphorus Doped Amorphous Silicon), or a metallic material such as aluminum, tungsten, titanium, cobalt, hafnium or tantalum.

The anti-reflection film 27 is an oxide insulation film such as aluminum, hafnium, titanium or tantalum, or may be an insulation film having different negative fixed charges. As the negative fixed charges, hafnium oxide, tantalum oxide, ammonium oxide, zirconium oxide or titanium oxide may be used.

The oxide film 28 is an accumulated oxide film such as an HDP (High Density Plasma) oxide film.

Next, a modification of the solid-state imaging device which includes the penetration-type vertical transistor 29 will be described with reference to FIGS. 4A to 4C and FIGS. 5A and 5B. Further, in FIGS. 4A to 4C and FIGS. 5A and 5B, a plan view of the solid-state imaging device is shown on an upper side, and a cross-sectional view taken along a dashed-dotted line in the plan view is shown in a lower side. In FIGS. 4A to 4C and FIGS. 5A and 5B, the FD 24, the gate insulation film 25, the anti-reflection film 27 and the oxide film 28 are omitted.

Figure 4A:
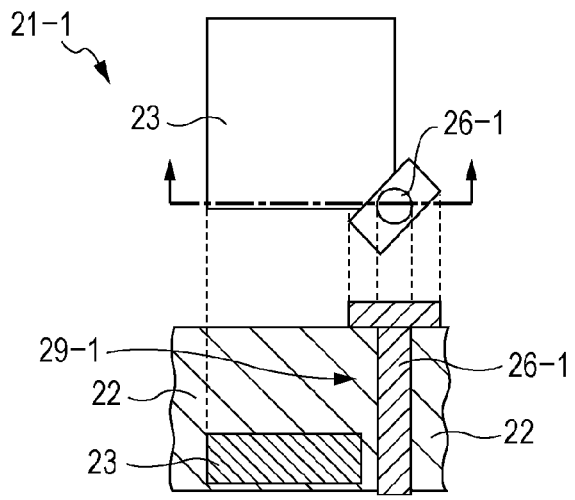
FIGS. 4A to 4C are diagrams illustrating a modification of the solid-state imaging device including the penetration-type vertical transistor.

FIG. 4A shows a solid-state imaging device 21-1 which is a first modification. In the solid-state imaging device 21-1, a gate electrode 26-1 is formed in a cylindrical form.

Figure 4B:
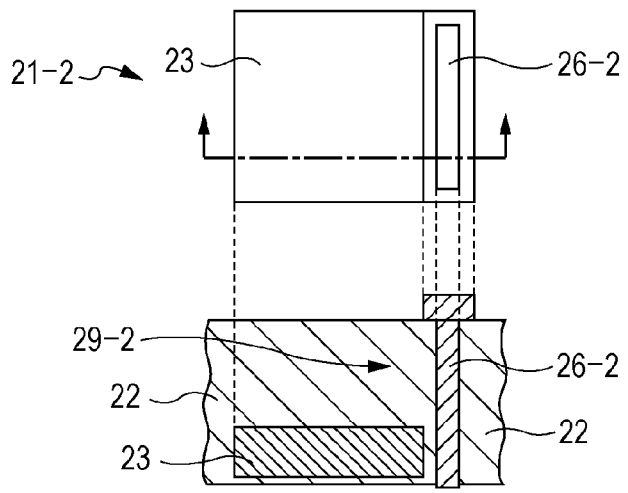

FIG. 4B shows a solid-state imaging device 21-2 which is a second modification. In the solid-state imaging device 21-2, a gate electrode 26-2 is formed in an elongated rectangular cylinder form along one side of the PD 23. That is, in the solid-state imaging device 21-2, the gate electrode 26-2 is formed so that the transfer gate area when charges are transferred from the PD 23 is enlarged. Thus, it is possible to enhance the transfer efficiency of the charges.

Figure 4C:
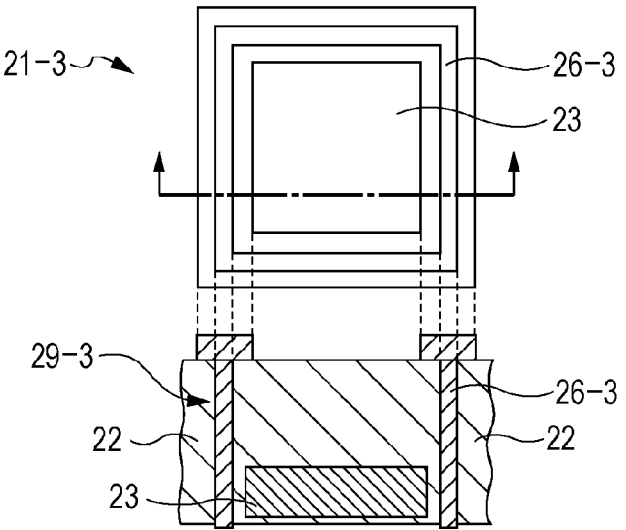

FIG. 4C shows a solid-state imaging device 21-3 which is a third modification. In the solid-state imaging device 21-3, a gate electrode 26-3 is formed in a rectangular form when seen from a planar view to surround an outer periphery of the PD 23. That is, the PD 23 is disposed for each pixel, and in the solid-state imaging device 21-3, the gate electrode 26-3 is formed to surround the PD 23 to thereby perform a function of separating the pixels. Further, in the solid-state imaging device 21-3, since the transfer gate area when the charges are transferred from the PD 23 is enlarged, it is possible to enhance the transfer efficiency of the charges.

Figure 5A:
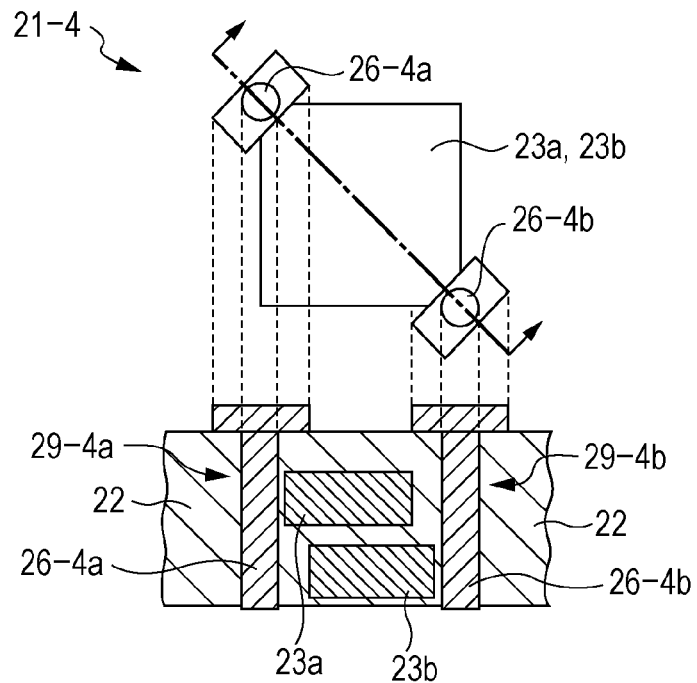
FIGS. 5A and 5B are diagrams illustrating a modification of a solid-state imaging device including a penetration-type vertical transistor.

FIG. 5A shows a solid-state imaging device 21-4 which is a fourth modification. In the solid-state imaging device 21-4, two PDs 23a and 23b are disposed in the semiconductor substrate 22 at different depths. Further, in the solid-state imaging device 21-4, a gate electrode 26-4a which forms a penetration-type vertical transistor 29-4a which transfers charges of the PD 23a and a gate electrode 26-4b which forms a penetration-type vertical transistor 29-4b which transfers charges of the PD 23b are disposed.

Figure 5B:
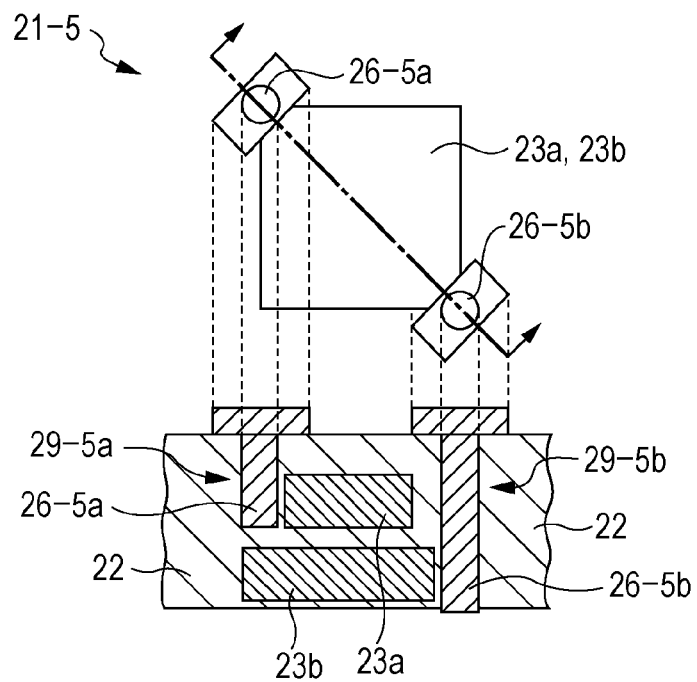

FIG. 5B shows a solid-state imaging device 21-5 which is a fifth modification. In the solid-state imaging device 21-5, two PDs 23a and 23b are disposed in the semiconductor substrate 22 at different depths. Further, in the solid-state imaging device 21-5, a gate electrode 26-5a which forms a penetration-type vertical transistor 29-5a which transfers charges of the PD 23a and a gate electrode 26-5b which forms a penetration-type vertical transistor 29-5b which transfers charges of the PD 23b are disposed.

In this way, in the solid-state imaging device 21, it is possible to arrange the plurality of (two in the example in FIGS. 5A and 5B) PDs 23 at the depth corresponding to the wavelength dependency of the light absorption coefficient of light which is incident on the semiconductor substrate 22 in a single pixel. Further, the plurality of penetration-type vertical transistors 29 are disposed corresponding to the respective PDs 23.

At this time, at least a part of the plurality of penetration-type vertical transistors 29 may protrude from the surface of the semiconductor substrate 22 on the rear surface side, as described with reference to FIGS. 3A to 3C. That is, in the solid-state imaging device 21-4 in FIG. 5A, tip end sections of both of the penetration-type vertical transistors 29-4a and 29-4b protrude from the surface of the semiconductor substrate 22 on the rear surface side. On the other hand, in the solid-state imaging device 21-5 in FIG. 5B, only a tip end section of the penetration-type vertical transistor 29-5b protrudes from the surface of the semiconductor substrate 22 on the rear surface side. In this way, in the solid-state imaging device 21, it is possible to appropriately adjust the depth of the penetration-type vertical transistor 29 according to the configuration or the like of the PD 23.

In the modifications of the solid-state imaging device 21 shown in FIGS. 4A to 4C and FIGS. 5A and 5B, the structure in which the gate electrode 26 protrudes from the surface of the semiconductor substrate 22 on the rear surface side, that is, the structure of the penetration-type vertical transistor 29A shown in FIG. 3A is shown, but the present disclosure is not limited thereto. That is, it is possible to apply the structure of the penetration-type vertical transistor 29B or 29C to the respective modifications of the solid-state imaging device 21.

Figure 6:
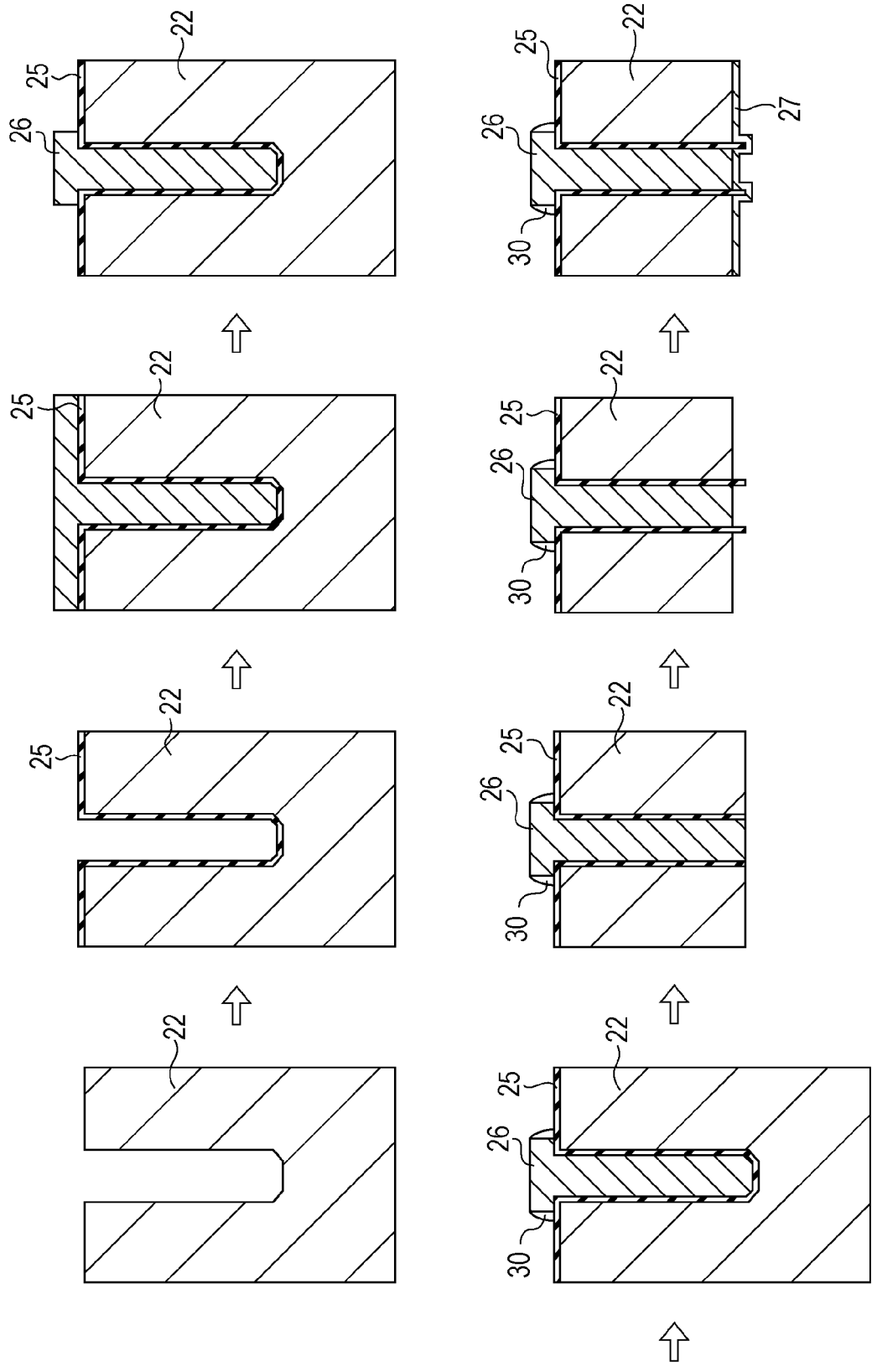
FIG. 6 is a diagram illustrating a manufacturing process of a solid-state imaging device.

Next, a manufacturing process of the solid-state imaging device 21 will be described with reference to FIG. 6.

In a first process, a trench for forming the penetration-type vertical transistor 29 is formed in a p-type semiconductor substrate 22, for example, which is a first conductive type. Although not shown, before the process of forming the trench in the semiconductor substrate 22, the PD 23 is formed. The PD 23 is formed by alternately and repeatedly layering an n-type semiconductor area which is a second conductive type and a p-type semiconductor area which is a first conductive type, at the depth corresponding to the wavelength dependency of the light absorption coefficient of the light which is incident on the semiconductor substrate 22, by an ion implantation method. Further, the respective pixels are separated by the semiconductor substrate 22 which is the first conductive type.

In a second process, the gate insulation film 25 is formed on the front surface of the semiconductor substrate 22 and inside the trench formed in the first process. For example, the gate insulation film 25 is a silicon oxide film obtained by thermally oxidizing silicon, silicon oxynitride, or a high dielectric insulation film. As the high dielectric insulation film, hafnium oxide, hafnium silicate, nitrogen added hafnium aluminate, tantalum oxide, titanium dioxide, zirconium oxide, praseodymium oxide, yttrium oxide or the like is used.

In a third process, a material which becomes the gate electrode 26 through the gate insulation film 25 is inserted into the trench. Here, as the material which becomes the gate electrode 26, a doped silicon material such as PDAS (Phosphorus Doped Amorphous Silicon), or a metallic material such as aluminum, tungsten, titanium, cobalt, hafnium or tantalum is used.

In a fourth process, a resist mask (not shown) corresponding to the area in which the gate electrode 26 is formed is formed, and the gate electrode 26 is processed by anisotropic etching using the resist as a mask. Then, in order to terminate an interface state between the gate electrode 26 and the semiconductor substrate 22, an annealing process is performed in a chlorine atmosphere.

In a fifth process, an oxide film, a nitride film or the like is accumulated on the front surface of the semiconductor substrate 22, and then anisotropic etching is performed, to thereby form a side wall 30. After formation of the side wall 30, in a similar way to a typical solid-state imaging device, a plurality of wiring layers (not shown) accompanied by an interlayer insulation film are formed on the front surface side of the semiconductor substrate 22. Further, a semiconductor substrate (not shown) which supports the semiconductor substrate 22 is bonded on the top layer of the front surface side of the semiconductor substrate 22.

In a sixth process, for example, by polishing the rear surface side of the semiconductor substrate 22, a thin film process is performed to achieve a desired film thickness so that the tip end section of the gate electrode 26 on the rear surface side is exposed to the surface of the semiconductor substrate 22 on the rear surface side. For example, the thickness of the semiconductor substrate 22 is preferably about 0.1 µm to about 100 µm, and more preferably about 1 µm to about 10 µm.

In a seventh process, the surface of the semiconductor substrate 22 on the rear surface side and the tip end surface of the gate electrode 26 on the rear surface side retreat by a solution which etches back the semiconductor substrate 22 and the gate electrode 26, for example, an SC1 solution which is water solution of ammonium hydroxide and hydrogen peroxide water. In this way, as the surface of the semiconductor substrate 22 on the rear surface side and the tip end surface of the gate electrode 26 on the rear surface side are removed, the gate insulation film 25 protrudes. Here, the gate insulation film 25 protrudes by about 0.1 nm to about 300 nm, for example. The process of making the gate insulation film 25 protrude may be performed by CMP (Chemical Mechanical Polishing).

In an eighth process, the anti-reflection film 27 is accumulated on the rear surface side of the semiconductor substrate 22. Further, after the anti-reflection film 27 is formed, the oxide film 28 (FIGS. 3A to 3C) is accumulated. The anti-reflection film 27 is an oxide insulation film such as aluminum, tantalum, hafnium, titanium or lanthanum. As the anti-reflection film 27, an insulation film having different negative fixed charges may be used. As the negative fixed charges, hafnium oxide, tantalum oxide, ammonium oxide, zirconium oxide or titanium oxide may be used. The anti-reflection film 27 may be formed by ALD (Atomic Layer Deposition), for example, and then the film thickness may be increased by HDP (High Density Plasma).

Further, after the eighth process, a light blocking film (not shown) is accumulated on an area in which light is not incident on the inside of the semiconductor substrate 22. The light blocking film is formed by tungsten, titanium, aluminum, or the like. Further, a planarization film, a color filter and an on-chip microlens (not shown) are sequentially formed.

According to the above-described manufacturing processes, it is possible to form the penetration-type vertical transistor 29C having the structure in which the gate insulation film 25C protrudes from the surface of the semiconductor substrate 22 on the rear surface side, as shown in FIG. 3C.

Next, another manufacturing process of the solid-state imaging device 21 will be described with reference to FIG. 7. This manufacturing method is different from the manufacturing method described with reference to FIG. 6 in that an SOI (Silicon On Insulator) substrate is used as the semiconductor substrate 22.

In a first process, a trench for forming the penetration-type vertical transistor 29 is formed in a p-type semiconductor substrate 22, for example, which is a first conductive type. At this time, the trench is processed to reach a BOX layer 31 of the SOI substrate. When a mask formed on the front surface of the semiconductor substrate 22 is removed so as to form the trench, a part of the BOX layer 31 which is present on a tip end side of the trench retreats. Thus, as shown in FIG. 7, a space is formed in the part of the BOX layer 31 on the tip end side of the trench.

Although not shown, before the process of forming the trench in the semiconductor substrate 22, the PD 23 is formed. The PD 23 is formed by alternately and repeatedly layering an n-type semiconductor area which is a second conductive type and a p-type semiconductor area which is a first conductive type, at the depth corresponding to the wavelength dependency of the light absorption coefficient of the light which is incident on the semiconductor substrate 22, by an ion implantation method. Further, the respective pixels are separated by the semiconductor substrate 22 which is the first conductive type.

Then, second to fifth processes are performed. The second to fifth processes are the same as the second to fifth processes described with reference to FIG. 6, and description thereof will be omitted.

Further, in a sixth process, a thin film process is performed with respect to the semiconductor substrate 22. This thin film process is performed by removing the semiconductor substrate which is on the rear surface side (lower side in FIG. 7) with reference to the BOX layer 31 of the semiconductor layer 22 by polishing, and then by removing the BOX layer 31 by wet etching or dry etching. CMP (Chemical Mechanical Polishing) may be used for removal of the BOX layer 31, or combination of these processes methods may be used.

Thereafter, seventh and eighth processes are performed. The seventh and eighth processes are the same as the seventh and eighth processes described with reference to FIG. 6, and description thereof will be omitted.

The solid-state imaging device 21 having the penetration-type vertical transistor 29 is manufactured by the above-described processes. Further, in the tip end section of the penetration-type vertical transistor 29, the step difference is formed between the surface of the semiconductor substrate 22 on the rear surface side and the tip end surface of the gate electrode 26 on the rear surface side. That is, in the configuration of the solid-state imaging device 21A in FIG. 3A, the gate insulation film 25A and the gate electrode 26A protrude from the surface of the semiconductor substrate 22 on the rear surface side, to thereby form the step difference. Further, in the configuration of the solid-state imaging device 21B in FIG. 3B, the gate insulation film 25B is formed up to the surface of the semiconductor substrate 22 on the rear surface side and the gate electrode 26B is formed to be recessed from the surface of the semiconductor substrate 22 on the rear surface side, to thereby form the step difference. Further, in the configuration of the solid-state imaging device 21C in FIG. 3C, the gate electrode 26C is formed up to the surface of the semiconductor substrate 22 on the rear surface side and the gate insulation film 25C is formed to protrude from the surface of the semiconductor substrate 22 on the rear surface side, to thereby form the step difference.

As the step difference is formed in this way, an interval according to the step difference is formed between the an area where the electric field between the semiconductor substrate 22 and the gate electrode 26 is strong and the film which is formed in the rear surface process such as an anti-reflection film 27 or an oxide film 28. Further, in the manufacturing process, the anti-reflection film 27 or the like is prevented from being interposed between the semiconductor substrate 22 and the gate electrode 26. Accordingly, in the solid-state imaging device 21, it is possible to suppress the generation of the gate leakage current.

Further, the solid-state imaging device 21 to which the penetration-type vertical transistor 29 having such a configuration is applied can obtain stable pixel characteristics without generating white spots or dark current due to the gate leakage current. Further, a margin for process variation is enhanced, and variation does not occur in the pixel characteristics. Accordingly, it is possible to achieve superior images in the solid-state imaging device 21.

Figure 8:
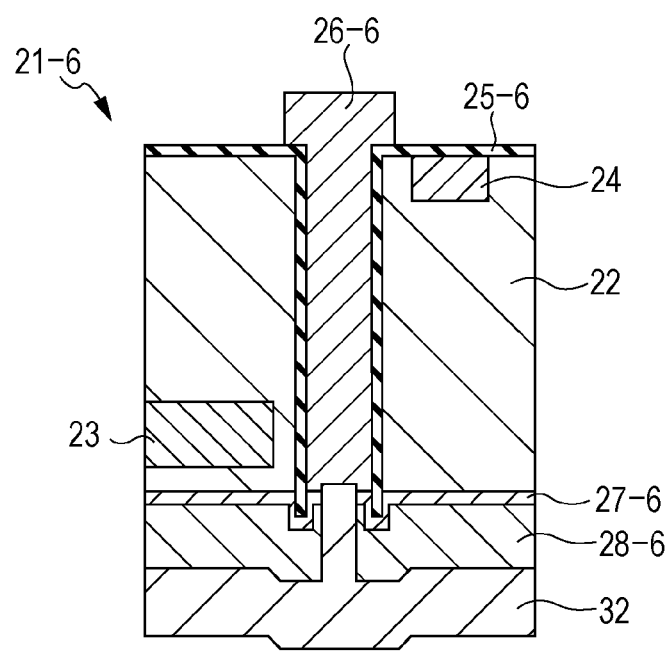
FIG. 8 is a diagram illustrating a modification of a solid-state imaging device including a penetration-type vertical transistor.

FIG. 8 shows a solid-state imaging device 21-6 which is a sixth modification.

In the solid-state imaging device 21-6, a gate insulation film 25-6 protrudes from the semiconductor substrate 22 and the surface of a gate electrode 26-6 on the rear surface side. Further, while insulation between the semiconductor substrate 22 and the gate electrode 26-6 is secured in the solid-state imaging device 21-6, a metallic material 32 which is disposed on the rear surface side of the semiconductor substrate 22 and the gate electrode 26-6 are connected with each other.

The metallic material 32 is a wiring which is electrically connected to the gate electrode 26-6, and voltage is applied to the metallic material 32 through the gate electrode 26-6, or is applied to the gate electrode 26-6 though the metallic material 32. For example, in the solid-state imaging device 21-6, a different material or structure may be stacked on the rear surface side of the metallic material 32. Specifically, in a configuration that an upper transparent electrode and a lower transparent electrode with a photoelectric conversion film being interposed therebetween is disposed on the rear surface side of the metallic material 32, by applying voltage to the upper transparent electrode and fixing voltage of the lower transparent electrode through the gate electrode 26-6 and the metallic material 32, the charges generated on the photoelectric conversion film are transferred to the substrate.

Further, the metallic material 32 has a function of a light blocking film which is formed to open corresponding to the PD 23 and blocks the light in the area where the light does not irradiate the semiconductor substrate 22. Further, the metallic material 32 is formed of aluminum, tungsten, titanium, cobalt, hafnium, tantalum, a variety of silicide materials, or the like.

In a case where the light blocking effect is not necessary, a transmissive conductive film (not shown) may be adopted as the wiring which is electrically connected to the gate electrode 26-6, instead of the metallic material 32. This transmissive conductive film is formed of ITO (Indium-tin-oxide), ZnO, In2O3, SnO2, grapheme, or the like.

Figure 9:
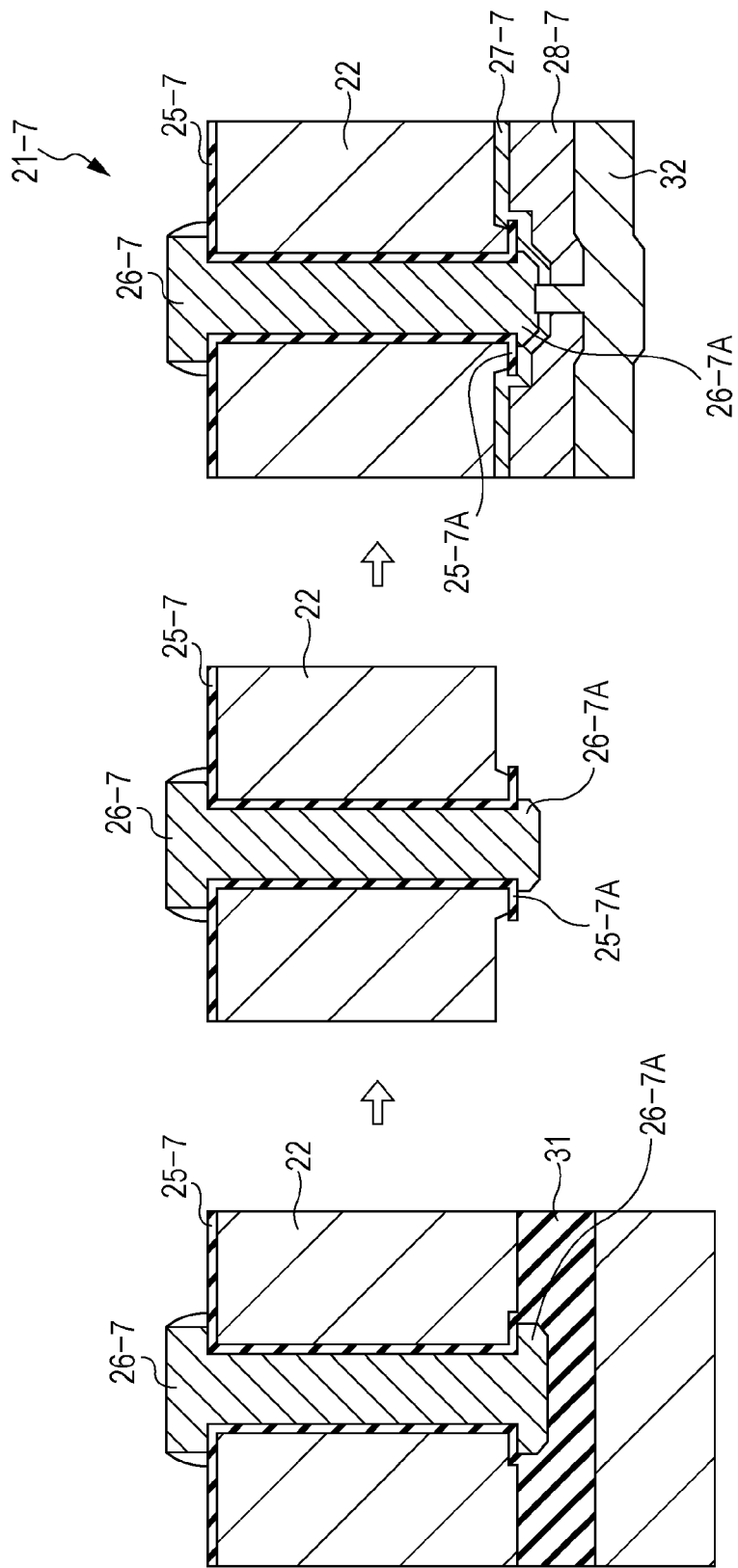
FIG. 9 is a diagram illustrating a modification of a solid-state imaging device including a penetration-type vertical transistor and a manufacturing process thereof.

FIG. 9 shows a solid-state imaging device 21-7 which is a seventh modification and a part of a manufacturing process thereof.

Figure 7:
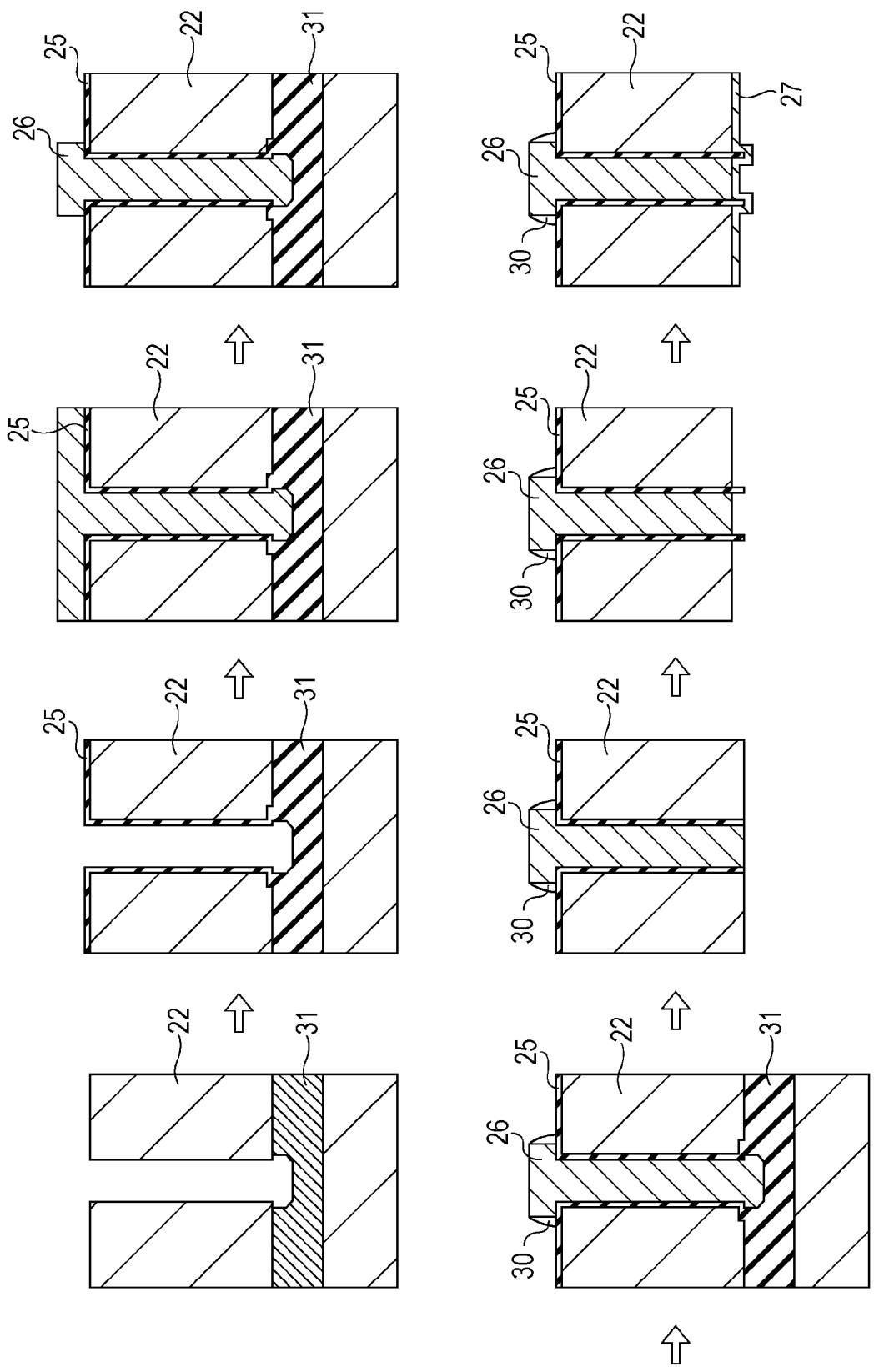
FIG. 7 is a diagram illustrating another manufacturing process of a solid-state imaging device.

The solid-state imaging device 21-7 is manufactured by the SOI substrate described in the manufacturing process of FIG. 7. As described with reference to FIG. 7, the first to fifth processes are performed, as shown on the left side of FIG. 9, a gate electrode 26-7 is inserted into a trench formed in the semiconductor substrate 22. At this time, as described above, a space is formed in a part of the BOX layer 31 on the tip end side of the trench, and a tip end section 26-7A of the gate electrode 26-7 fills in the space.

When a thin film processing is performed from this state, the BOX layer 31 is removed so that the tip end section 26-7A formed at a tip end of the gate electrode 26-7 on the rear surface side is not removed and remains. Further, at this time, the BOX layer 31 is removed so that a flange section 25-7A is also formed on a tip end of a gate insulation film 25-7 on the rear surface side.

Further, an anti-reflection film 27-7 is formed on the rear surface side of the semiconductor substrate 22, and an oxide film 28-7 is formed. Thereafter, a through hole is formed up to the gate electrode 26-7 through the anti-reflection film 27-7 and the oxide film 28-7, and the metallic material 32 is disposed therein to be connected with the tip end section 26-7A of the gate electrode 26-7.

In this way, by using the tip end section 26-7A formed on the gate electrode 26-7, when seen from the rear surface side, the area of the tip end section 26-7A is broader than the area of the gate electrode 26-7. Thus, it is possible to easily perform the wiring work when the metallic material 32 is connected.

Further, the above-described solid-state imaging device 21 may be applied to a variety of electronic apparatuses such as an imaging system such as a digital still camera or a digital video camera, a portable phone including an imaging function, or a different apparatus including an imaging function.

Figure 10:
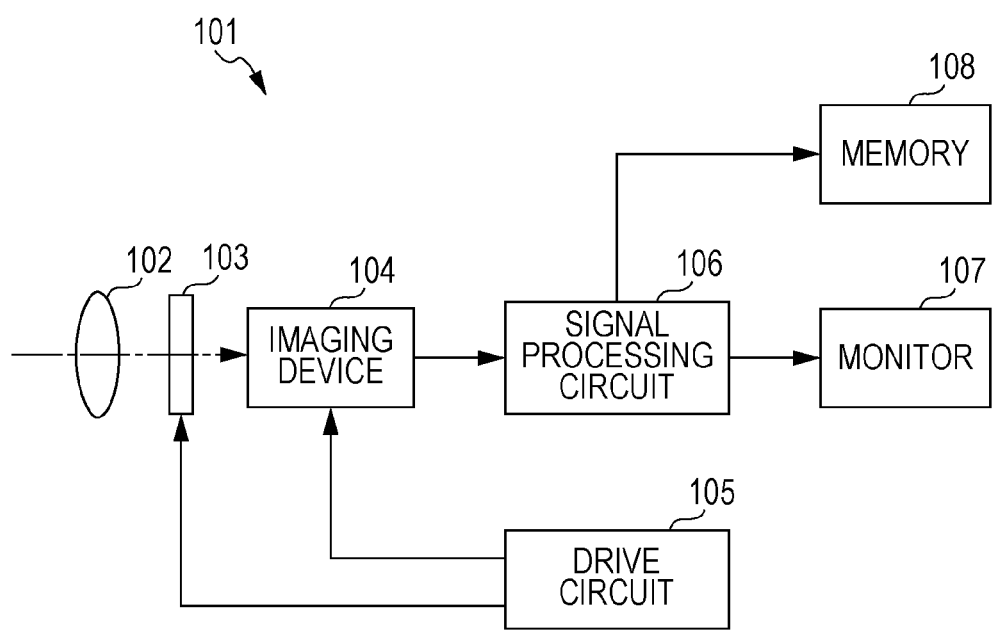
FIG. 10 is a block diagram illustrating a configuration example of an imaging apparatus which is mounted on an electronic apparatus.

FIG. 10 is a block diagram illustrating a configuration example of an imaging apparatus mounted on an electronic apparatus.

As shown in FIG. 10, an imaging apparatus 101 includes an optical system 102, a shutter device 103, an imaging device 104, a drive circuit 105, a signal processing circuit 106, a monitor 107 and a memory 108, and can image a still image and a moving image.

The optical system 102 includes one or plural lenses, and guides image light (incident light) from an object to the imaging device 104, and forms an image on a light receiving surface (sensor section) of the imaging device 104.

The shutter device 103 is disposed between the optical system 102 and the imaging device 104, and controls a light irradiation period and a light blocking period to the imaging device 104, under the control of the drive circuit 105.

As the imaging device 104, any one of the solid-state imaging device 21 according to the above-described embodiments and modifications is used. Signal charges are accumulated on the imaging device 104 for a predetermined time, according to the image formed on the light receiving surface through the optical system 102 and the shutter device 103. Further, the signal charges accumulated on the imaging device 104 are transferred according to a drive signal (timing signal) supplied from the drive circuit 105.

The drive circuit 105 outputs a drive signal of controlling the transfer operation of the imaging device 104 and the shutter operation of the shutter device 103 to drive the imaging device 104 and the shutter device 103.

The signal processing circuit 106 performs a variety of signal processes with respect to the signal charges output from the imaging device 104. The image (image data) obtained by the signal processing of the signal processing circuit 106 is supplied to the monitor 107 to be displayed, or is supplied to the memory 108 to be stored (recorded).

In the imaging apparatus 101 configured as described above, as the imaging device 104, the solid-state imaging device 21 having the above-described superior pixel characteristics may be used, thereby enhancing the image quality.

In the above-described embodiments, the configuration example in which the CMOS solid-state imaging device of the rear surface irradiation type is adopted as the solid-state image device 21, but the structure of the solid-state imaging device 21 may be applied to a CMOS solid-state imaging device of a front surface irradiation type, a CCD solid-state imaging device or the like.

Further, the embodiments of the present disclosure are not limited to the above-described embodiments, and a variety of modifications can be made in the range without departing the spirit of the present disclosure.

The present disclosure contains subject matter related to that disclosed in Japanese Priority Patent Application JP 2011-038668 filed in the Japan Patent Office on Feb. 24, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof

What is claimed is:

1. A solid-state imaging device comprising:
    a semiconductor substrate including a first surface and a second surface that face opposite sides;
    a gate insulation film on a trench formed in the semiconductor substrate to penetrate the first surface and the second surface;
    at least one photodiode disposed in the semiconductor substrate; and
    a gate electrode embedded in the trench through the gate insulation film to be exposed to a second surface side of the semiconductor substrate,
    wherein,
        the second surface of the semiconductor substrate is below a region of the semiconductor substrate in which the at least one photodiode is disposed, and
        a step difference exists between the second surface of the semiconductor substrate and at least one of (a) a tip end surface of the gate electrode on the second surface side and (b) a tip end surface of the gate insulation film on the second surface side.

2. The solid-state imaging device according to claim 1, wherein the gate electrode and the gate insulation film protrude from the second surface of the semiconductor substrate to form the step difference between the second surface of the semiconductor substrate and the tip end surfaces of the gate electrode and the gate insulation film on the second surface side.

3. The solid-state imaging device according to claim 1, wherein:
    the gate insulation film extends up to the second surface of the semiconductor substrate, and
    the gate electrode is recessed from the second surface of the semiconductor substrate to form the step difference between the second surface of the semiconductor substrate and the tip end surface of the gate electrode on the second surface side.

4. The solid-state imaging device according to claim 1, wherein:
    the gate electrode extends up to the second surface of the semiconductor substrate, and
    the gate insulation film protrudes from the second surface of the semiconductor substrate and the tip end surface of the gate electrode on the second surface side to form the step difference between the second surface of the semiconductor substrate and the tip end surface of the gate insulation film on the second surface side.

5. The solid-state imaging device according to claim 1, wherein:
    the at least one photodiode is one photodiode that is provided for each of a plurality of pixels disposed in a surface direction along the first or second surface, and
    the gate electrode is formed to surround the photodiode for each of the plurality of pixels.

6. The solid-state imaging device according to claim 1, wherein:
    the at least one photodiode is a plurality of photodiodes that are respectively disposed in the semiconductor substrate at different depths and are provided for each of a plurality of pixel units disposed in a surface direction along the first or second surface,
    a respective gate electrode is provided for each of the photodiodes,
    at least one gate electrode among the respective gate electrodes is the gate electrode, and the step difference exists between the second surface of the semiconductor substrate and at least one of (a) the tip end surface of the gate electrode on the second surface side and (b) the tip end surface of the gate insulation film on the second surface side.

7. The solid-state imaging device according to claim 1, further comprising:
an anti-reflection film in contact with the semiconductor substrate on the second surface of the semiconductor substrate.

8. The solid-state imaging device according to claim 7, wherein the anti-reflection film is an oxide insulation film of silicon, aluminum, hafnium, tantalum, titanium, or lanthanum.

9. The solid-state imaging device according to claim 1, wherein the gate insulation film is a silicon oxide film or a silicon oxynitride film.

10. The solid-state imaging device according to claim 1, wherein the gate electrode is formed of PDAS (Phosphorus Doped Amorphous Silicon), aluminum, tungsten, titanium, cobalt, hafnium or tantalum.

11. A solid-state imaging device comprising:
a semiconductor substrate including a first surface and a second surface that face opposite sides;
a gate insulation film on a trench formed in the semiconductor substrate to penetrate the first surface and the second surface;
a gate electrode embedded in the trench through the gate insulation film to be exposed to a second surface side of the semiconductor substrate; and
a wiring disposed on the second surface side of the semiconductor substrate and connected to the gate electrode,
wherein,
a step difference exists between the second surface of the semiconductor substrate and at least one of (a) a tip end surface of the gate electrode on the second surface side and (b) a tip end surface of the gate insulation film on the second surface side.

12. The solid-state imaging device according to claim 11, wherein the wiring is formed of a metallic material including aluminum, tungsten, titanium, cobalt, hathium, tantalum, or silicide material.

13. The solid-state imaging device according to claim 11, wherein the wiring is a transmissive conductive film which is formed of ITO (Indium-tin-oxide), ZnO, $In_2O_3$, $SnO_2$ or graphene.

14. An electronic apparatus comprising a solid-state imaging device, the solid-state imaging device including:
a semiconductor substrate including a first surface and a second surface that face opposite sides;
a gate insulation film on a trench formed in the semiconductor substrate to penetrate the first surface and the second surface;
at least one photodiode disposed in the semiconductor substrate; and
a gate electrode embedded in the trench through the gate insulation film to be exposed to a second surface side of the semiconductor substrate,
wherein,
the second surface of the semiconductor substrate is below a region of the semiconductor substrate in which the at least one photodiode is disposed, and
a step difference exists between the second surface of the semiconductor substrate and at least one of (a) a tip end surface of the gate electrode on the second surface side and (b) a tip end surface of the gate insulation film on the second surface side.

15. The electronic apparatus according to claim 14, wherein, in the solid-state imaging device, the gate electrode and the gate insulation film protrude from the second surface of the semiconductor substrate to form the step difference between the second surface of the semiconductor substrate and the tip end surfaces of the gate electrode and the gate insulation film on the second surface side.

16. The electronic apparatus according to claim 14, wherein, in the solid-state imaging device:
the gate insulation film extends up to the second surface of the semiconductor substrate, and
the gate electrode is recessed from the second surface of the semiconductor substrate to form the step difference between the second surface of the semiconductor substrate and the tip end surface of the gate electrode on the second surface side.

17. The electronic apparatus according to claim 14, wherein, in the solid-state imaging device:
the gate electrode extends up to the second surface of the semiconductor substrate, and
the gate insulation film protrudes from the second surface of the semiconductor substrate and the tip end surface of the gate electrode on the second surface side to form the step difference between the second surface of the semiconductor substrate and the tip end surface of the gate insulation film on the second surface side.

18. The electronic apparatus according to claim 14, wherein, in the solid-state imaging device:
the at least one photodiode is one photodiode that is provided for each of a plurality of pixels disposed in a surface direction along the first or second surface, and
the gate electrode is formed to surround the photodiode for each of the plurality of pixels.

19. The electronic apparatus according to claim 14, wherein, in the solid-state imaging device:
the at least one photodiode is a plurality of photodiodes that are respectively disposed in the semiconductor substrate at different depths and are provided for each of a plurality of pixel units disposed in a surface direction along the first or second surface,
a respective gate electrode is provided for each of the photodiodes,
at least one gate electrode among the respective gate electrodes is the gate electrode, and
the step difference exists between the second surface of the semiconductor substrate and at least one of (a) the tip end surface of the gate electrode on the second surface side and (b) the tip end surface of the gate insulation film on the second surface side.

* * * * *